United States Patent [19]

Su

[11] Patent Number: 4,923,267
[45] Date of Patent: May 8, 1990

[54] OPTICAL FIBER SHIFT REGISTER

[75] Inventor: Shing-Fong Su, Southboro, Mass.

[73] Assignee: GTE Laboratories Incorporated, Waltham, Mass.

[21] Appl. No.: 280,045

[22] Filed: Dec. 5, 1988

[51] Int. Cl.$^5$ .................... G02B 6/28; G11C 17/00; G11C 5/06; G06F 7/56
[52] U.S. Cl. ..................... 350/96.16; 350/76.14; 350/96.15; 350/356; 377/64; 377/70; 365/64; 365/76; 365/77; 365/78; 364/200; 364/713; 307/409
[58] Field of Search ............... 350/96.13, 96.14, 96.15, 350/96.16, 354, 355, 356, 393; 377/64, 70, 74; 250/227; 364/200, 713, 822, 824; 370/1, 3; 455/608, 610, 612, 617; 365/64, 76, 77, 78, 120, 215, 233, 234; 307/409, 429

[56] References Cited

U.S. PATENT DOCUMENTS

| | | | |
|---|---|---|---|
| 2,833,936 | 5/1958 | Ress | 350/96.29 X |
| 3,208,342 | 9/1965 | Nethercot, Jr. | 350/96.29 X |
| 3,445,827 | 5/1969 | Keyes | 365/64 X |
| 3,781,081 | 12/1973 | Rokos | 350/96.14 X |
| 4,154,501 | 5/1979 | Fischer | 350/96.25 |
| 4,363,106 | 12/1982 | Tai | 364/713 X |
| 4,558,920 | 12/1985 | Newton et al. | 350/96.15 |
| 4,588,255 | 5/1986 | Tur et al. | 350/96.16 |
| 4,620,180 | 10/1986 | Carlton | 377/64 X |
| 4,748,630 | 5/1988 | Nagashima | 372/8 |
| 4,761,060 | 8/1988 | Sawano | 350/354 |
| 4,859,018 | 8/1989 | O'Sullivan et al. | 350/96.16 |

FOREIGN PATENT DOCUMENTS 3511072 10/1986 Fed. Rep. of Germany ... 365/64 X
58-187912 11/1983 Japan ............................ 350/96.14 X

OTHER PUBLICATIONS

An Ultrafast All-Optical Switch.
R. A. Thompson and P. P. Giordano, "An Experimental Phototonic Time-Slot Interchanger Using Optical Fibers as Reentrant Delay-Line Memories", J. Lightwave Technology, vol. LT-5, pp. 154–162, Jan., 1987.
H. Goto, "Photonic Time-Division Switching Technology", Technical Digest, Topical Meeting on Photonic Switching, pp. 132–134, Mar., 1987.

Primary Examiner—Brian Healy
Attorney, Agent, or Firm—James J. Cannon, Jr.

[57] ABSTRACT

An optical shift register constructed from at least two optical memory cells connected in cascade, each memory cell having an optical combiner, a 1×2 optical switch, a clock, and an optical amplifier, all connected by optical fibers. Each memory cell in the sequence is connected to the next sequential cell by an optical fiber from its output port to the input port of the next sequential cell. The input port of the first optical memory cell serves as the input to the shift register. The output port of the last sequential optical memory cell serves as the output port of the shift register. Each cell is controlled by a clock, all clocks operating at the same rate, but each out of phase with the clock in the next sequential cell. Control signals are provided by said clocks to shift optical pulses from one cell to the next for the enter-shift-exit cycle of the shift register.

8 Claims, 1 Drawing Sheet

OPTICAL FIBER SHIFT REGISTER

BACKGROUND OF THE INVENTION

This invention relates to optical components generally, that is components which operate in the optical domain. Such components are designed for use in various systems which utilize optical fibers, such as optical communications systems, optical data processing systems and optical switching systems. Specifically, this invention pertains to an optical shift register.

The development of optical fiber and optical semiconductor technologies in recent years has made possible various types of optical communications systems and optical switching systems. To utilize the full bandwidth and speed available in optical systems, it has become necessary to design and fabricate optical logic and switching components which eliminate the necessity for electrical-to-optical and optical-to-electrical conversions.

Electronic shift registers have played a major role in digital electronic systems for many decades. Numerous electronic systems and subsystems have been based on electronic shift registers. Typical examples are digital delay lines, serial-to-parallel and parallel-to-serial converters, counters, random access memories and electronic switching systems. Despite the rapid development of optical fiber technology, optical shift registers have received only scant attention. This phenomenon is due primarily to the fact that electronic systems have improved rapidly over time and always seemed to be sophisticated enough to meet the needs of the telecommunications industry. However, the deployment of optical fibers for information transmission has necessitated a different approach to this problem. At present, the high bandwidth advantage of optical fibers is still not fully utilized because electronic switching systems are not fast enough for high speed and high throughput optical switching. To solve this problem, the switching functions must be performed in the optical domain, eliminating the optical-to-electrical and electrical-to-optical conversions.

Two embodiments of an optical shift register are disclosed in U.S. Pat. No. 4,761,060. In one embodiment, the optical shift register comprises a series of optical D flip-flops connected in cascade through light branching circuits. In the other embodiment, the optical D flip-flops are connected in tandem through branching circuits and use optical waveguide switches within the flip-flops. The optical shift registers disclosed in this patent require an optical bistable element, have critical and somewhat inflexible timing requirements and have a relatively complex structure.

SUMMARY OF THE INVENTION

The principal object of the present invention is to provide an optical shift register in which optical pulses are shifted sequentially without being converted to electrical pulses.

Another object of the invention is to provide an optical shift register which can be implemented using integrated optics technology.

Still another object of the invention is to provide an optical shift register in which adjacent optical pulses are well isolated, causing no crosstalk.

A further object of the present invention is to provide an optical shift register which is simple in both structure and operation, while having none of the shortcomings of the prior art optical shift register devices or their electronic equivalents when used in optical systems.

Still another object of the invention is to provide such a shift register in which the optical paths are short.

A further object of the invention is to provide an optical shift register in which the speed of the shift register may be adjusted according to the incoming data rate.

Still a further object of the invention is to provide an optical shift register for which the control timing is simple and not as critical as in the prior art.

In one aspect of the invention, a single bit optical shift register is constructed from two cascaded optical memory cells. Each memory cell consists of a $1 \times 2$ optical switch, a passive optical combiner, delay line fibers and an optical amplifier. The two optical switches in the single bit shift register, one in each memory cell, are controlled by two clocks. When the clocks are high, the optical switches are in the cross-over state; when the clocks are low, the switches are in the straight-through state. These clocks run at the same rate, but out of phase with each other. When the first clock is low and the second clock is high, an optical pulse can enter the first memory cell. When the first clock is high and the second clock is low, the optical pulse is shifted to the next cell. When the clocks again change to first clock low and second clock high, the optical pulse can exit the single bit shift register. This enter-shift-exit cycle repeats at the rate of the two clocks. Admitting a pulse to the first memory cell and exiting a pulse from the second cell need not be synchronous. The clock rate of the clocks is adjustable to accommodate various input data rates.

In a second aspect of the invention, a multibit optical shift register is constructed by cascading a number of single bit shift registers together. There is no change in the operational principles.

The above and other objects, features and advantages of this invention are illustrated in the following detailed description, in which reference is made to the accompanying drawings.

DESCRIPTION OF THE PREFERRED EMBODIMENTS

Figure 1:
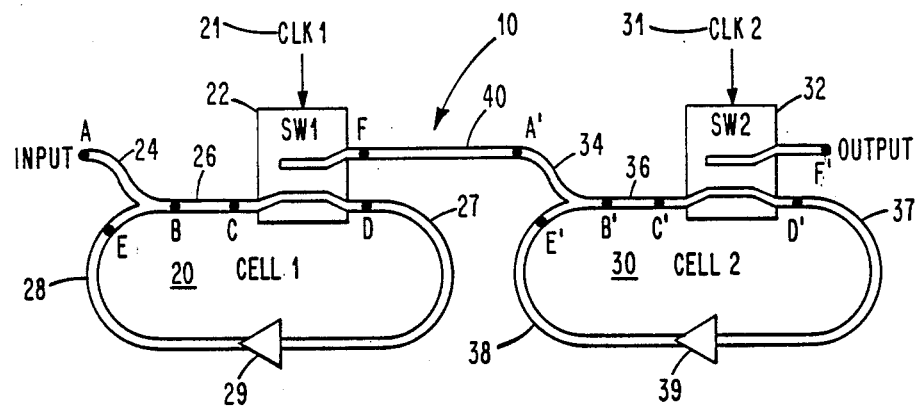
FIG. 1 is a diagrammatic illustration of the preferred embodiment of a single bit optical shift register according the present invention.

FIG. 1 is a diagrammatic illustration of the preferred embodiment of a single bit optical shift register 10 constructed in accordance with the principles of the present invention. Optical shift register 10 consists of two cascaded optical memory cells 20, 30. The optical memory cell described and illustrated herein has been disclosed in a copending U.S. patent application entitled, "OPTICAL MEMORY CELL", Ser. No. 280,396, pending filed December, 1988 by the inventor of this application and assigned to the same assignee. Said application is incorporated herein by reference, and specifically the drawings and the description of the preferred embodiments are incorporated herein by reference with respect to the structure and operation of said optical memory cell. Each memory cell 20, 30 is controlled by a clock 21, 31 and comprises a $1 \times 2$ optical switch 22, 32, a passive optical combiner 24, 34, delay line fibers 26, 27, 28 and 36, 37, 38, and optional optical amplifiers 29, 39. The structure and operation of a single optical memory cell have been described in the copending application incorporated by reference herein. For convenience, a simplified description of the operation of the optical memory cell is repeated here. Using the first optical memory cell 20 as an example, when switch 22 is operated in the straight-through state, an optical pulse may enter the memory cell 20 through port A of optical combiner 24 and then circulate around the closed loop B-C-D-E-B continuously. An optional optical amplifier 29 may be used to compensate for the optical losses caused by the 1×2 optical switch 22, the passive optical combiner 24, and the optical fibers 26, 27, 28. These optical amplifiers could be discrete components or distributed optical fiber amplifiers. When it is desired to output the optical pulse from cell 20, switch 22 is switched to the cross-over state. The optical pulse in cell 20 will exit from port F.

Figure 2:
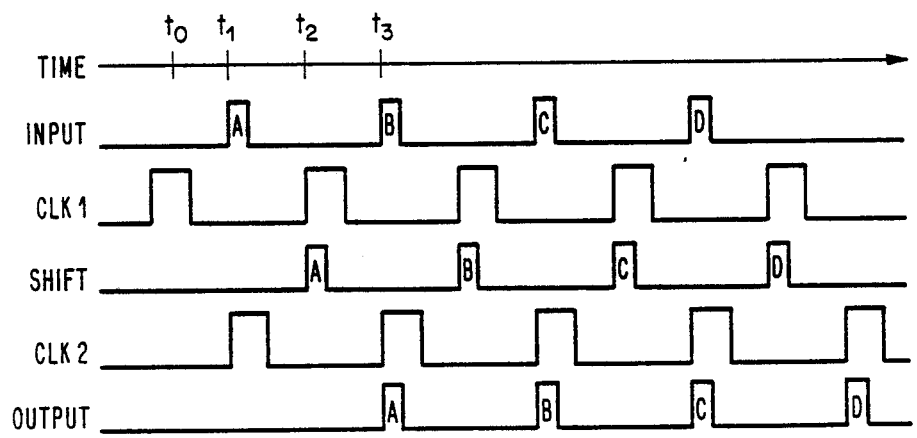
FIG. 2 is a timing control diagram of the single bit optical shift register of FIG. 1.

Single bit optical shift register 10 is constructed by connecting two identical optical memory cells 20, 30 in cascade. This connection is made by connecting output port F of memory cell 20 to input port A′ of memory cell 30 with an optical fiber 40. The optical switches 22, 32 in the optical shift register 10 are controlled by clocks 21, 31 respectively. When the clocks are high, the optical switches are in the cross-over state. When the clocks are low, they are in the straight-through state. Clocks 21, 31 could be optical or electrical clocks, depending on the types of optical switches 22, 32 used in optical shift register 10. For example, if switches 22, 32 are LiNbO3-based directional couplers or cross-couplers, clocks 21, 31 are electrical. If switches 22, 32 are pure optical switches, then clocks 21, 31 are optical. As shown in FIG. 2, clocks 21, 31 are running at the same rate but out of phase with each other. The duty cycles for clocks 21, 31 are less than fifty percent.

To elucidate the operation of optical shift register 10, we assume that it is empty at the beginning of an operation. Referring now to FIG. 2, at time $t=t_0$, clock 21 is high, clock 31 is low, switch 22 is in the cross-over state, and switch 32 is in the straight-through state. At this time, there is no optical pulse on the input to shift register 10, so shift register 10 is idle. At $t=t_1$, clock 21 is low, clock 31 changes to high, switch 22 switches over to the straight-through state, and switch 32 switches over to the cross-over state. At this moment $t_1$, optical pulse A is allowed to enter memory cell 20. But there is no output from memory cell 30 because it is empty. At $t=t_2$, clock 21 changes to high and clock 31 changes to low. Switch 22 changes to the cross-over state, while switch 32 changes to the straight-through state. This allows optical pulse A to shift from cell 20 to cell 30. At $t=t_3$, clock 21 is low and clock 31 changes to high. Switch 22 switches to the straight-through state and switch 32 switches to the cross-over state. This allows optical pulse A to exit from memory cell 30 through output port F′. At the same time, $t=t_3$ optical pulse B is allowed to enter memory cell 20 through input port A. This enter-shift-exit cycle repeats at the rate of clock 21 and clock 31. However, it should be pointed out that admitting an optical pulse to memory cell 20 and outputting an optical pulse from memory cell 30 need not be exactly synchronous. The first memory cell 20, which serves as the input to optical shift register 10, may accept an optical pulse at any time so long as clock 21 is low and stays low long enough for the entire optical pulse to get into cell 20. The shift of an optical pulse from cell 20 to cell 30 is synchronous with clock 21 since that shift is controlled by clock 21. Similarly, outputting an optical pulse from cell 30 is synchronous with clock 31, since switch 32 is controlled by clock 31. The clock rate of clocks 21 and 31 is adjustable and it can be adjusted to accommodate various input data rates.

The single bit optical shift register described above may also be used as an optical memory with flexible delay.

FIG. 1 illustrates only a single bit optical shift register. Multibit optical shift registers can be implemented by cascading a number of single bit shift registers together. The operational principles do not change at all.

A variety of 1×2 optical switches may be used in memory cells 20, 30. At the present time, electro-optic switches, such as LiNbO3-based directional couplers and cross-couplers, are good candidates for this application because their technologies are relatively mature compared with those of pure optical switching elements. A pure optical switching element, such as a nonlinear optical coupler, as described in Friberg et al., "An ultrafast all-optical switch," Photonic Switching, Springer Series in Electronics and Photonics 25, pp. 92–94, 1988 will be a better element to use when it becomes available and practical.

The concept, structure and operational principle of the optical shift register described herein are independent of the technology used to implement this optical shift register. The shift register 10 made from memory cells 20, 30, of the present invention can be implemented not only using discrete components, as shown in FIG. 1, but also using integrated optic technology, or other advanced technologies.

A variety of photonic systems, subsystems and/or components can be implemented which are based on and/or utilize the optical shift register of the present invention, such as photonic serial-to-parallel and parallel-to-serial converters, photonic elastic stores and optical time slot interchanges. The optical shift register is a needed building block for photonic switching. It enables a variety of optical switching architectures which were not considered feasible before. For example, in existing optical time-division switching architectures, the time slot interchanges are accomplished by using the demultiplexing/storing/retrieving/multiplexing procedures, as disclosed in R. A. Thompson and P.O. Giordano, "An experimental photonic time-slot interchanger using optical fibers as reentrant delay-line memories," J. Lightwave Technology, vol. LT-5, pp. 154-162, January 1987, and H. Goto "Photonic time-division switching technology," Technical Digest, Topical Meeting on Photonic Switching, pp. 132–134, March 1987. New optical switching architectures equipped with optical shift registers will no longer need the demultiplexing process.

The novel optical shift register of the present invention offers many features and advantages over prior art devices, most of which were not optical devices. Optical pulses are shifted sequentially without being converted to electrical pulses. The adjacent optical pulses are well isolated, causing no crosstalk. The physical length of the optical paths in the memory cells is short. This optical shift register can be implemented using integrated optics technology, principally because the physical length of the optic fiber is short. The speed of the optical shift register may be adjusted according to the incoming data rate. And timing control of this novel optical shift register is relatively easy and simple.

I claim:

1. An optical shift register, comprising:

at least two optical memory cells, each of said optical memory cells comprising:

an optical switch having an input end adapted to receive an optical pulse, a first output end, a second output end and a control means, said switch being adapted to switchably couple an optical pulse from said first input end to said first output end in its straight-through state and to switchably couple an optical pulse from said input end to said second output end in its cross-over state, responsive to control signals;

an optical combiner having first and second input ends and an output end adapted to receive an optical pulse on either input end and output said optical fiber pulse on said output end;

an optical fiber connecting said output end of said optical combiner to said input end of said optical switch;

an optical fiber connecting said first output end of said optical switch to said second input end of said optical combiner;

such that said optical switch in its straight-through state, said optical combiner and said optical fibers form a memory cell in the form of an optical loop capable of storing a circulating optical pulse;

said first input end of said optical combiner serving as an input port to said memory cell;

said second output end of said optical switch serving as an output port from said memory cell when said optical switch is in its cross-over state; and clock means providing signals to control the input of an optical pulse to said memory cell and the output of said optical pulse from said memory cell;

said optical memory cells being connected sequentially in cascade by connecting the output port of a first memory cell to the input port of an adjacent memory cell in a sequence of memory cells, such that the input port of the first memory cell in said sequence is the input port of said shift register and the output port of the last memory cell in said sequence is the output port of said shift register;

said clock means of each of said memory cells operating at the same clock rate, but out of phase with said clock means in an adjacent memory cell;

whereby the shifting of an optical pulse results from the output of said pulse from a first memory cell and the input of said pulse into the next sequential memory cell.

2. The optical shift register of claim 1 further comprising:

an optical amplifier positioned within said loop to compensate for optical losses incurred by an optical pulse circulating within said loop.

3. The optical shift register of claim 1 wherein said optical switch means is an electro-optical switch.

4. The optical shift register of claim 1 wherein said optical switch means is a directional coupler.

5. The optical shift register of claim 1 wherein said optical switch means is a cross-coupler.

6. The optical shift register of claim 1 wherein said optical switch means is a nonlinear optical coupler.

7. The optical shift register of claim 1 wherein said optical combiner is a fiber coupler.

8. The optical shift register of claim 1 wherein said optical combiner is a waveguide coupler.

* * * * *